(12) United States Patent
Kim et al.

(10) Patent No.: US 12,484,263 B2
(45) Date of Patent: Nov. 25, 2025

(54) TRANSISTOR DEVICE, TERNARY INVERTER DEVICE INCLUDING SAME, AND MANUFACTURING METHOD THEREFOR

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Jae Won Jeong, Seoul (KR); Young Eun Choi, Ulsan (KR); Woo Seok Kim, Daegu (KR)

(73) Assignee: UNIST (ULSAN NATIONAL INSTITUTE OF SCIENCE AND TECHNOLOGY) (KR)

( * ) Notice: Subject to any disclaimer, the term of this patent is extended or adjusted under 35 U.S.C. 154(b) by 901 days.

(21) Appl. No.: 17/419,676

(22) PCT Filed: Dec. 16, 2019

(86) PCT No.: PCT/KR2019/017782
§ 371 (c)(1),
(2) Date: Jun. 29, 2021

(87) PCT Pub. No.: WO2020/141756
PCT Pub. Date: Jul. 9, 2020

(65) Prior Publication Data
US 2022/0085155 A1     Mar. 17, 2022

(30) Foreign Application Priority Data
Dec. 31, 2018  (KR) .................. 10-2018-0174229
Jul. 5, 2019   (KR) .................. 10-2019-0081519

(51) Int. Cl.
 H10D 84/85  (2025.01)
 H01L 21/265 (2006.01)
 H10D 62/10  (2025.01)

(52) U.S. Cl.
 CPC ..... H10D 62/102 (2025.01); H01L 21/26513 (2013.01); H10D 84/85 (2025.01)

(58) Field of Classification Search
 CPC ....... H01L 29/66545; H01L 21/823821; H01L 21/845; H01L 29/1054; H01L 29/66803;
 (Continued)

(56) References Cited

U.S. PATENT DOCUMENTS 7,202,131 B2   4/2007  Bang
8,748,270 B1*  6/2014  Shifren ............... H10D 62/307
                                                     438/289

(Continued)

FOREIGN PATENT DOCUMENTS

JP   3886716 B   2/2007
JP   6060718 B   1/2017
(Continued)

OTHER PUBLICATIONS

International Search Report and Written Opinion for PCT/KR2019/017782, mailed Apr. 16, 2020 (w/English ISR).
(Continued)

*Primary Examiner* — Moin M Rahman
(74) *Attorney, Agent, or Firm* — Klarquist Sparkman, LLP

(57) ABSTRACT

A transistor device includes a substrate, a source region provided on the substrate, a drain region in the substrate, spaced apart from the source region in a direction parallel to a top surface of the substrate, a gate electrode provided on the substrate and between the source region and the drain region, a gate insulating film interposed between the gate
(Continued)

electrode and the substrate, and a constant current generating layer extending between the source region and the drain region, in the direction parallel to the top surface of the substrate, wherein the constant current generating layer generates a constant current between the drain region and the substrate, and the constant current is independent from a gate voltage applied to the gate electrode.

7 Claims, 13 Drawing Sheets

(58) Field of Classification Search
CPC .......... H01L 29/66818; H01L 29/7853; H01L 29/7854; H01L 29/51; H01L 29/10; H01L 29/78; H01L 21/28; H01L 29/785; H01L 21/823857; H01L 29/66795; H01L 21/28194; H01L 29/513; H01L 29/517; H01L 29/0607; H01L 21/26513; H01L 27/092; H01L 29/105; H01L 29/1083; H01L 27/0727; H01L 21/823892; H01L 23/5226; H01L 23/528; H01L 29/41775; H01L 29/42324; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/7883; H01L 21/76831; H01L 21/76805; H01L 21/76224; H01L 21/02603; H01L 21/28568; H01L 21/30604; H01L 25/105; H01L 21/30625; H01L 21/6835; H01L 21/31116; H01L 21/3065; H01L 21/02068; H01L 21/32134; H01L 21/32136; H01L 21/32137; H01L 21/3213; H01L 21/0228; H03K 19/09425; H10B 43/27; H10B 41/27; H10B 41/30; H10B 43/30; H10B 43/40; H10B 43/10; H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/02; H10D 84/0193; H10D 84/853; H10D 84/85; H10D 30/6728; H10D 30/6733; H10D 30/6735; H10D 62/118; H10D 89/931; H10D 64/252; H10D 84/0188; H10D 84/201; H10D 18/60; H10D 62/121; H10D 30/024; H10D 30/62; H10D 30/794; H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364; H10D 62/102; H10D 62/314; H10D 62/371; H10D 84/811; H10D 84/0191; H10D 84/038; H10D 30/673; H10D 30/689; H10D 30/6713; H10D 62/021; H10D 64/015; H10D 64/671; H10D 30/60–798; H10D 30/021–0415; H10D 84/83–859; H10D 84/0128; H10D 84/0167; H10D 62/85–854; H10D 30/751; H10D 30/027–0278; H10D 30/63; H10D 84/016; H10D 84/0195; H10D 30/501–509; H10D 84/014; H10D 84/0158; H10D 84/0177; H10D 84/834; H10D 86/215; H10D 30/6215; H10D 30/0217; H02K 15/027; A23B 2/783; A45C 11/003; A61K 40/4218; H10F 77/955; H10H 20/826; B82Y 10/00
See application file for complete search history.

(56) References Cited

U.S. PATENT DOCUMENTS

| | | | |
|---|---|---|---|
| 9,478,571 B1 * | 10/2016 | Bakhishev | H04N 25/77 |
| 10,141,400 B2 | 11/2018 | Lee | |
| 10,198,023 B2 | 2/2019 | Yoshino | |
| 2002/0125509 A1 * | 9/2002 | Tichauer | H10D 62/307 |
| | | | 257/E29.054 |
| 2011/0090731 A1 * | 4/2011 | Chi | H10D 30/701 |
| | | | 257/E27.111 |
| 2011/0303990 A1 * | 12/2011 | Dornel | H01L 21/26586 |
| | | | 257/E21.409 |
| 2016/0035631 A1 * | 2/2016 | Lee | H01L 22/20 |
| | | | 438/16 |
| 2018/0074788 A1 * | 3/2018 | Kim | H03K 19/20 |
| 2020/0098867 A1 * | 3/2020 | Li | H01L 29/7831 |

FOREIGN PATENT DOCUMENTS

| | | |
|---|---|---|
| KR | 19990073669 A | 10/1999 |
| KR | 20010016838 A | 3/2001 |
| KR | 20050070932 A | 7/2005 |
| KR | 20090011493 A | 2/2009 |
| KR | 20160088074 A | 7/2016 |
| KR | 20170082179 | 7/2017 |
| KR | 20180111690 | 10/2018 |

OTHER PUBLICATIONS

Notice of Allowance for Korean Patent Application No. 10-2019-0081519, mailed Dec. 16, 2020 (w/English translation).
Office Action for Korean Application No. 10-2019-0081519, mailed Jul. 14, 2020 (w/English translation).

* cited by examiner

TRANSISTOR DEVICE, TERNARY INVERTER DEVICE INCLUDING SAME, AND MANUFACTURING METHOD THEREFOR

CROSS REFERENCE TO RELATED APPLICATIONS

This is the U.S. National Stage of International Application No. PCT/KR2019/017782, filed Dec. 16, 2019, which in turn claims priority to Korean Patent Application No. 10-2018-0174229, filed Dec. 31, 2018, and Korean Patent Application No. 10-2019-0081519, filed Jul. 5, 2019, which applications are incorporated herein in their entireties.

TECHNICAL FIELD

The present disclosure relates to a transistor device, a ternary inverter device including the same, and a method of manufacturing the same.

BACKGROUND ART

In order to rapidly process a large amount of data, conventional binary logic-based digital systems have focused on increasing the bit density through the miniaturization of an CMOS device. However, with the recent integration to less than 30-nm, there was a limitation in increasing the bit density due to the increase in leakage current and power consumption due to the quantum tunneling effect. In order to overcome the limitation of the bit density, interest in a ternary logic device and a circuit, which are one of multi-valued logics, is rapidly increasing, and in particular, development of a standard ternary inverter (STI) as a basic unit for implementing a ternary logic has been actively carried out. However, unlike conventional binary inverters using two CMOS's with a single voltage source, there is an issue that the conventional techniques regarding STI require more voltage sources or a complicated circuit configuration.

DESCRIPTION OF EMBODIMENTS

Technical Problem

An object to be solved is to provide a transistor device having a constant current independent from a gate voltage.

An object to be solved is to provide a ternary inverter device having a constant current independent from an input voltage.

An object to be solved is to provide a method of manufacturing a transistor device having a constant current independent from a gate voltage.

However, the objects to be solved are not limited to those disclosed above.

Solution to Problem

According to an aspect, a transistor device including: a substrate; a source region provided on the substrate; a drain region in the substrate, the drain region being spaced apart from the source region in a direction parallel to a top surface of the substrate; a gate electrode provided on the substrate and between the source region and the drain region; a gate insulating film interposed between the gate electrode and the substrate; and a constant current generating layer extending between the source region and the drain region, in the direction parallel to the top surface of the substrate, wherein the constant current generating layer generates a constant current between the drain region and the substrate, and the constant current is independent from a gate voltage applied to the gate electrode, may be provided.

The constant current generating layer may be provided between a channel formed on the substrate and a bottom surface of the drain region.

The substrate and the constant current generating layer may have a first conductivity type, the source region and the drain region may have a second conductivity type that is different from the first conductivity type, and a doping concentration of the constant current generating layer may be greater than a doping concentration of the substrate.

The doping concentration of the constant current generating layer may be $3\times10^{18}$ cm$^{-3}$ or greater.

An electric field may be formed between the drain region and the constant current generating layer, and an intensity of the electric field may be $10^6$ V/cm or greater.

The substrate and the source region may have the same voltage.

According to an aspect, a ternary inverter device including: an NMOS transistor device; and a PMOS transistor device, wherein each of the NMOS transistor device and the PMOS transistor device includes: a well region; a source region and a drain region in the well region, the source region and the drain region being spaced apart from each other in a direction parallel to a top surface of the well region; and a constant current generating layer provided under the source region and under the drain region, wherein the constant current generating layer generates a constant current between the drain region and the well region, and the drain region of the NMOS transistor device and the drain region of the PMOS transistor device are electrically connected to each other and have the same voltage, may be provided.

Each of the NMOS transistor device and the PMOS transistor device may further include: a gate electrode provided on the well region; and a gate insulating film interposed between the gate electrode and the top surface of the well region, and the constant current may be independent from a gate voltage applied to the gate electrode.

The source region of the NMOS transistor device may be electrically connected to the well region of the NMOS transistor device and have the same voltage as the well region of the NMOS transistor device, and the source region of the PMOS transistor device may be electrically connected to the well region of the PMOS transistor device, and have the same voltage as the well region of the PMOS transistor device.

The drain region of the NMOS transistor device and the drain region of the PMOS transistor device may have a first voltage when the NMOS transistor device has a channel current that is stronger than the constant current and the PMOS transistor device has the constant current that is stronger than a channel current, have a second voltage when the NMOS transistor device has the constant current that is stronger than the channel current and the PMOS transistor device has the channel current that is stronger than the constant current, and have a third voltage when each of the NMOS transistor device and the PMOS transistor device has the constant current that is stronger than the channel current, and the second voltage may be greater than the first voltage, and the third voltage may have a value between the first voltage and the second voltage.

In each of the NMOS transistor device and the PMOS transistor device, the well region and the constant current generating layer may have conductivity types identical to each other, and a doping concentration of the constant current generating layer may be greater than a doping concentration of the well region.

In each of the NMOS transistor device and the PMOS transistor device, the doping concentration of the constant current generating layer may be $3 \times 10^{18}$ cm$^{-3}$ or greater.

According to an aspect, a method of manufacturing a transistor device including forming a constant current generating layer at an upper portion of a substrate; forming a gate structure on the substrate; and forming, at the upper portion of the substrate, a source region and a drain region that are spaced apart from each other in a direction parallel to a top surface of the substrate, with the constant current generating layer therebetween, wherein the gate structure comprises a gate insulating film and a gate electrode that are sequentially stacked on the substrate, and a pair of spacers provided on side surfaces of the gate electrode, the constant current generating layer generates a constant current between the drain region and the substrate, the constant current is independent from a gate voltage applied to the gate electrode, and the substrate and the constant current forming layer have the same conductivity type, may be provided.

The forming of the constant current generating layer may include: implanting an impurity into the upper portion of the substrate; and heat-treating the substrate, and the impurity may be implanted between a channel and a bottom surface of the drain region.

A thermal budget in the heat-treating may be controlled to adjust a magnitude of the constant current.

Advantageous Effects of Disclosure

The present disclosure may provide a transistor device having a constant current independent from a gate voltage.

The present disclosure may provide a ternary inverter device having a constant current independent from an input voltage.

The present disclosure may provide a method of manufacturing a transistor device having a constant current independent from a gate voltage.

However, the effects are not limited to those disclosed above.

MODE OF DISCLOSURE

Figure 1:
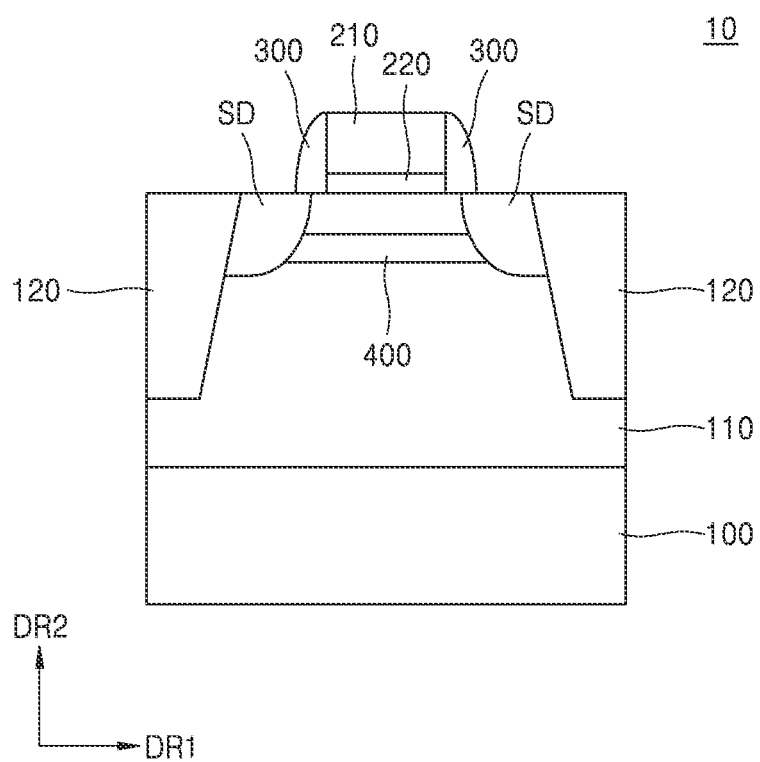
FIG. 1 is a diagram of a transistor device according to example embodiments.

Hereinafter, embodiments of the present disclosure will be described in detail with reference to the accompanying drawings. In the following drawings, like reference numerals refer to like elements, and sizes of elements in the drawings may be exaggerated for clarity and convenience of description. Meanwhile, the following embodiments are merely illustrative, and various modifications may be made from these embodiments.

Hereinafter, an expression "above" or "on" used herein may include not only "immediately on in a contact manner" but also "on in a non-contact manner".

An expression used in the singular encompasses the expression of the plural, unless it has a clearly different meaning in the context. In addition, when an element "includes" an element, unless there is a particular description contrary thereto, the element may further include other elements, not excluding the other elements.

Also, the terms described in the specification, such as " . . . er (or)", " . . . unit", etc., denote a unit that performs at least one function or operation, which may be implemented as hardware or software or a combination thereof.

FIG. 1 is a diagram of a transistor device according to example embodiments.

Referring to FIG. 1, a transistor device 10 may be provided. The transistor device 10 may include a substrate 100, a well region 110, a pair of device isolation regions 120, a pair of source/drain regions SD, a constant current generating layer 400, a gate electrode 210, a gate insulating film 220, and a pair of spacers 300.

The substrate 100 may be a semiconductor substrate. For example, the substrate 100 may be a silicon (Si) substrate, a germanium (Ge) substrate, or a silicon-germanium (SiGe) substrate. The substrate 100 may be an intrinsic semiconductor substrate.

The well region 110 may be provided in the substrate 100. The well region 110 may have a first conductivity type. For example, the first conductivity type may be n-type or p-type. In the case where the conductivity type of the well region 110 is n-type, the well region 110 may include a group V element (e.g., P, As) as an impurity. In the case where the conductivity type of the well region 110 is p-type, the well region 110 may include a group III element (e.g., B, In) as an impurity.

The pair of device isolation regions 120 spaced apart from each other in a first direction DR1 parallel to the top surface of the substrate 100 may be provided on the well region 110. The pair of device isolation regions 120 may extend in a second direction DR2 perpendicular to the top surface of the substrate 100. The pair of device isolation regions 120 may include an insulating material. For example, the pair of device isolation regions 120 may include silicon oxide (e.g., $SiO_2$).

The pair of source/drain regions SD spaced apart from each other in the first direction DR1 may be provided on the well region 110. One of the pair of source/drain regions SD may be a source of the transistor device. The other one of the pair of source/drain regions SD may be a drain of the transistor device. The pair of source/drain regions SD may have a second conductivity type different from the first conductivity type. In the case where the first conductivity type is n-type, the second conductivity type may be p-type. In the case where the conductivity type of the pair of source/drain regions SD is p-type, the pair of source/drain regions SD may include a group III element (e.g., B, In) as an impurity. In the case where the first conductivity type is p-type, the second conductivity type may be n-type. In the case where the conductivity type of the pair of source/drain regions SD is n-type, the pair of source/drain regions SD may include a group V element (e.g., P, As) as an impurity.

The constant current generating layer 400 may be provided above the substrate 100. The constant current generating layer 400 may be provided between the pair of source/drain regions SD. The constant current generating layer 400 may be electrically connected to the pair of source/drain regions SD. The constant current generating layer 400 may extend between lower portions of the pair of source/drain regions SD in the first direction DR1 to directly contact the lower portions of the pair of source/drain regions SD. The constant current generating layer 400 may overlap the lower portions of the pair of source/drain regions SD in the first direction DR1. The constant current generating layer 400 may be formed under a channel (not shown) of the transistor device 10. For example, the constant current generating layer 400 may be provided between a bottom surface of the channel and bottom surfaces of the source/drain regions SD. The channel may be formed between the constant current generating layer 400 and the top surface of the substrate 100 when the transistor device 10 has an on state.

The constant current generating layer 400 may have the first conductivity type. In the case where the conductivity type of the constant current generating layer 400 is n-type, the constant current generating layer 400 may include a group V element (e.g., P, As) as an impurity. In the case where the conductivity type of the constant current generating layer 400 is p-type, the constant current generating layer 400 may include a group III element (e.g., B, In) as an impurity. The doping concentration of the constant current generating layer 400 may be greater than the doping concentration of the well region 110. For example, the doping concentration of the constant current generating layer 400 may be $3 \times 10^{18}$ cm$^{-3}$ or greater. An electric field may be formed between the constant current generating layer 400 and the pair of source/drain regions SD. For example, the intensity of the electric field may be $10^6$ V/cm or greater.

The constant current generating layer 400 may generate a constant current between the source/drain region SD, which is a drain of the transistor device, among the pair of source/drain regions SD, and the well region 110. The constant current may be a band-to-band tunneling (BTBT) current between the source/drain region SD, which is the drain, and the constant current generating layer 400. The constant current may be independent from a gate voltage applied to the gate electrode 210. That is, the constant current may flow regardless of the gate voltage. In the case where the transistor device 10 is an NMOS transistor device, the constant current may flow from the source/drain region SD, which is the drain, to the well region 110 via the constant current generating layer 400. In the case where the transistor device 10 is a PMOS transistor device, the constant current may flow from the well region 110 to the source/drain region SD, which is the drain, via the constant current generating layer 400.

The gate electrode 210 may be provided above the well region 110. The gate electrode 210 may include an electrically conductive material. For example, the gate electrode may include a metal (e.g., Cu) or doped polysilicon (doped-poly Si).

The gate insulating film 220 may be provided between the gate electrode 210 and the top surface of the substrate 100. The gate insulating film 220 may electrically insulate the gate electrode 210 and the well region 110 from each other. The gate insulating film 220 may separate the gate electrode 210 and the substrate 100 from each other. The gate insulating film 220 may include an electrically insulating material. For example, the gate insulating film 220 may include $SiO_2$ or a high-k dielectric material (e.g., SiON, $HfO_2$, $ZrO_2$).

The pair of spacers 300 may be provided on both sidewalls of the gate electrode 210, respectively. The pair of spacers 300 may extend onto both sidewalls of the gate insulating film 220, respectively. The pair of spacers 300 may include an electrically insulating material. For example, the pair of spacers 300 may include $SiO_2$ or a high-k dielectric material (e.g., SiON, $HfO_2$, $ZrO_2$).

In example embodiments, a pair of lightly doped regions (not shown) may be provided on the pair of source/drain regions SD in the well region 110. The pair of lightly doped regions may be arranged between the pair of source/drain regions SD and the pair of spacers 300 immediately adjacent thereto, respectively. The pair of lightly doped regions may extend in the first direction DR1 to contact the pair of device isolation regions 120, respectively. The pair of lightly doped regions may have the second conductivity type. The doping concentration of the pair of lightly doped regions may be lower than the doping concentration of the pair of source/drain regions SD. The pair of lightly doped regions may reduce the occurrence of a short-channel effect and a hot-carrier effect. Accordingly, the electrical characteristics of the transistor device 10 may be improved.

The present disclosure may provide the transistor device 10 in which a constant current may flow between the source/drain region SD, which is the drain, and the well region 110.

Figure 2:
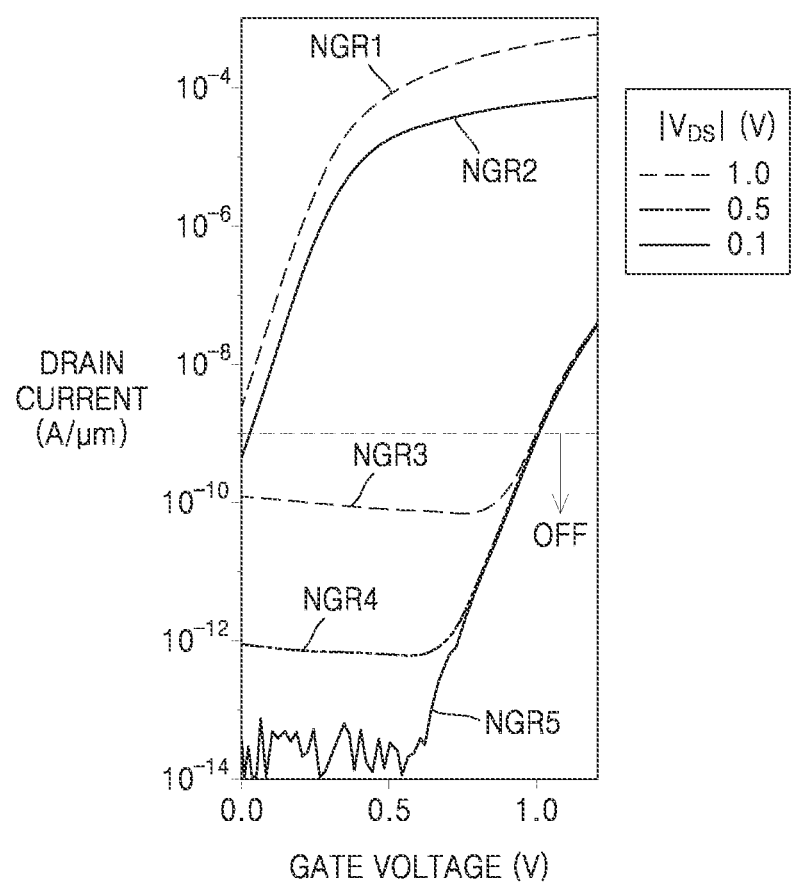
FIG. 2 shows gate voltage-drain current graphs of NMOS transistor devices according to the present disclosure and conventional NMOS transistor devices.

FIG. 2 shows gate voltage-drain current graphs of NMOS transistor devices according to the present disclosure and conventional NMOS transistor devices.

Referring to FIG. 2, gate voltage-drain current graphs NGR1 and NGR2 of the conventional NMOS transistor devices, and gate voltage-drain current graphs NGR3, NGR4, and NGR5 of the NMOS transistor devices according to the present disclosure are illustrated.

Drain currents of the conventional NMOS transistor devices did not have a constant current component flowing regardless of a gate voltage.

Drain currents of the NMOS transistor devices of the present disclosure had a constant current component flowing regardless of a gate voltage. For example, even when the NMOS transistor devices of the present disclosure had an off state, a constant current flowed through the NMOS transistor devices of the present disclosure.

Figure 3:
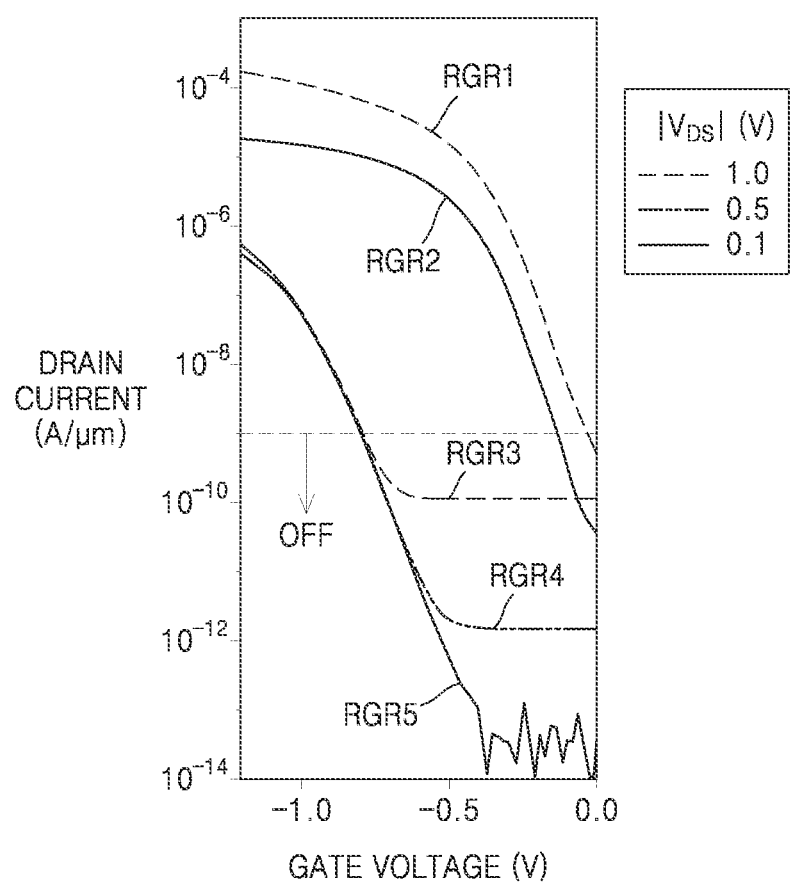
FIG. 3 shows gate voltage-drain current graphs of PMOS transistor devices of the present disclosure and conventional PMOS transistor devices.

FIG. 3 shows gate voltage-drain current graphs of PMOS transistor devices of the present disclosure and conventional PMOS transistor devices.

Referring to FIG. 3, gate voltage-drain current graphs RGR1 and RGR2 of the conventional PMOS transistor devices, and gate voltage-drain current graphs RGR3, RGR4, and RGR5 of the PMOS transistor devices according to the present disclosure are illustrated.

Drain currents of the conventional PMOS transistor devices did not have a constant current component flowing regardless of a gate voltage.

Drain currents of the PMOS transistor devices of the present disclosure had a constant current component flowing regardless of a gate voltage. For example, even when the PMOS transistor devices of the present disclosure had an off state, a constant current flowed through the PMOS transistor devices of the present disclosure.

Figure 4:
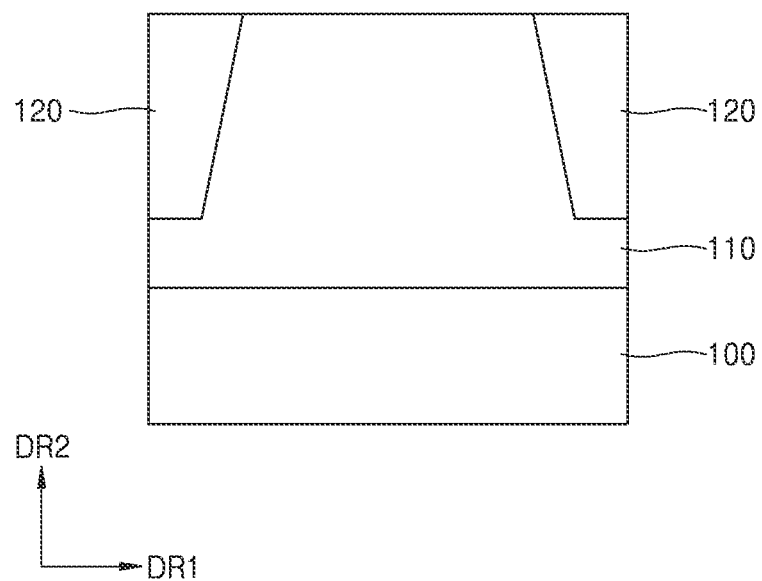
FIG. 4 is a diagram for describing a method of manufacturing the transistor device of FIG. 1.
Figure 5:
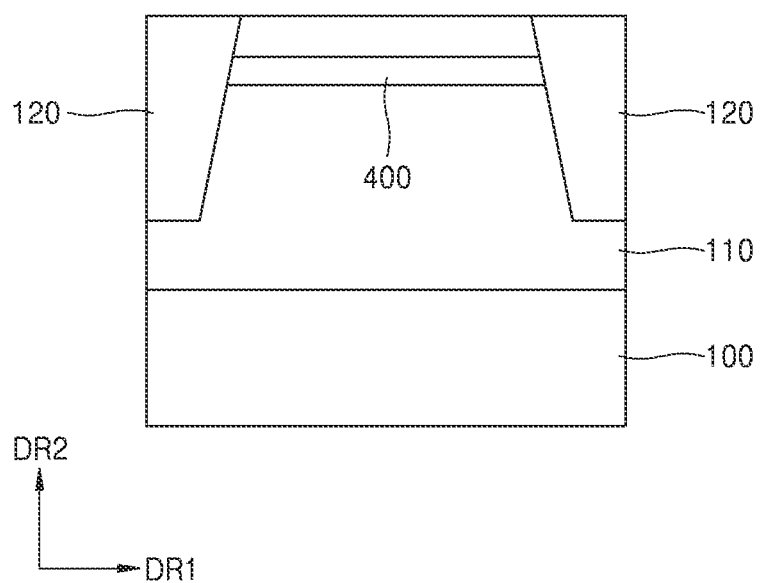
FIG. 5 is a diagram for describing a method of manufacturing the transistor device of FIG. 1.
Figure 6:
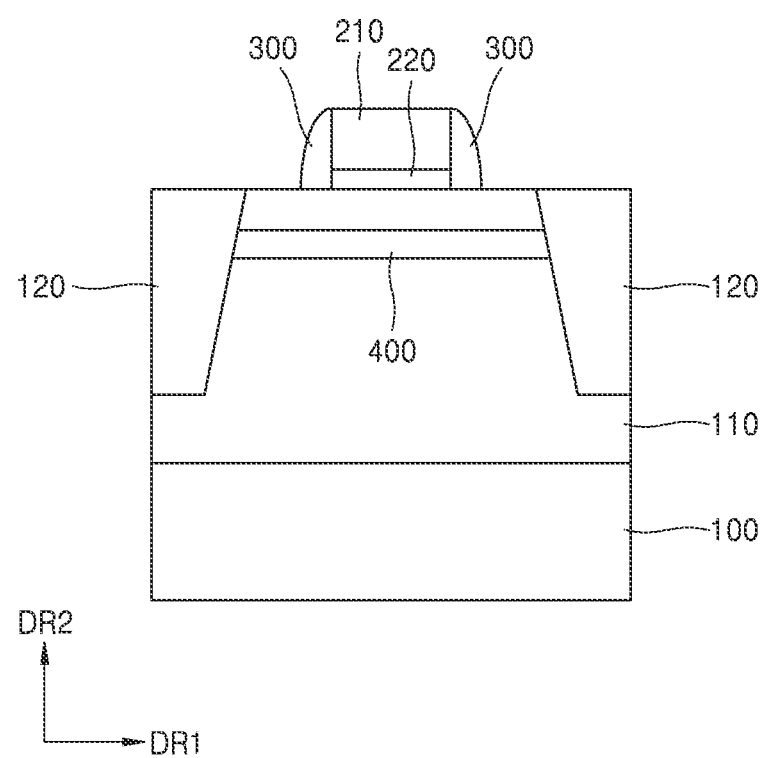
FIG. 6 is a diagram for describing a method of manufacturing the transistor device of FIG. 1.

FIG. 4 is a diagram for describing a method of manufacturing the transistor device of FIG. 1. FIG. 5 is a diagram for describing a method of manufacturing the transistor device of FIG. 1. FIG. 6 is a diagram for describing a method of manufacturing the transistor device of FIG. 1. For brevity of description, substantially the same descriptions as provided with reference to FIG. 1 may not be provided.

Referring to FIG. 4, the substrate 100 may be provided. The substrate 100 may be a semiconductor substrate. For example, the substrate 100 may be a silicon (Si) substrate, a germanium (Ge) substrate, or a silicon-germanium (SiGe) substrate. The substrate 100 may be an intrinsic semiconductor substrate.

The pair of device isolation regions 120 may be formed in the substrate 100. A process of forming the pair of device isolation regions 120 may include forming a pair of recess regions by recessing the substrate 100 to a certain depth, and filling the pair of recess regions with an electrically insulating material. For example, the pair of recess regions may be formed by performing an anisotropic etching process on the substrate 100. For example, the electrically insulating material may be provided to the pair of recess regions by a chemical vapor deposition process or a physical vapor deposition process.

The well region 110 may be formed between the pair of device isolation regions 120. The well region 110 may be formed by performing a process of doping the substrate 100 to a certain depth. For example, the doping process may include a diffusion process and/or an ion implantation process. In the case where an upper portion of the substrate 100 is doped with a group V element (e.g., P, As), the conductivity type of the well region 110 may be n-type. In the case where the upper portion of the substrate 100 is doped with a group III element (e.g., B, In), the conductivity type of the well region 110 may be p-type.

Referring to FIG. 5, the constant current generating layer 400 may be formed on the well region 110. For example, the constant current generating layer 400 may be formed to be deeper than the channel of the transistor device 10 (FIG. 1) described with reference to FIG. 1, but to be shallower than bottom surfaces of the pair of source/drain regions SD (FIG. 1). Forming of the constant current generating layer 400 may include performing an ion implantation process. The constant current generating layer 400 may have the same conductivity type as the well region 110. In the case where the conductivity type of the well region 110 is n-type, a group V element (e.g., P, As) may be further implanting into an upper portion of the well region 110 to form the n-type constant current generating layer 400. In the case where the conductivity type of the well region 110 is p-type, a group III element (e.g., B, In) may be further implanted into the upper portion of the well region 110 to form the p-type constant current generating layer 400.

After an impurity is implanted into the upper portion of the well region 110, the well region 110 may be heat-treated. A thermal budget of a heat treatment process may affect a threshold voltage characteristic and a constant current of the transistor device 10 (FIG. 1). For example, in the case where the thermal budget is greater than that required, the impurity implanted into the upper portion of the well region 110 may be diffused into the channel and thus change a threshold voltage. For example, in the case where the thermal budget is greater than that required, the doping concentration between the pair of source/drain regions SD and the constant current generating layer 400 may be gradually changed, and thus the magnitude of the constant current may be decreased. When performing the heat treatment process, the thermal budget may be adjusted such that the threshold voltage characteristic of the transistor device 10 (FIG. 1) is not changed or is minimally changed, and the transistor device 10 (FIG. 1) has a required constant current.

Referring to FIG. 6, the gate electrode 210, the gate insulating film 220, and the pair of spacers 300 may be formed above the substrate 100. Forming of the gate electrode 210 and the gate insulating film 220 may include performing a process of sequentially depositing an insulating material (e.g., $SiO_2$, SiON, $HfO_2$, $ZrO_2$) and a conductive material (e.g., a metal or doped polysilicon) on the substrate 100, and a process of patterning a deposited layer formed by the deposition process. For example, the deposition process may include a chemical vapor deposition process or a physical vapor deposition process. For example, the patterning process may include forming a mask pattern on the deposited layer, and performing an anisotropic etching process using the mask pattern on the deposited layer as an etch mask. The mask pattern may be removed during the anisotropic etching process or after the anisotropic etching process is completed.

Forming of the pair of spacers 300 may include forming an insulating film on the substrate 100 and performing an anisotropic etching process on the insulating film. For example, the insulating film may be formed by conformally depositing an insulating material (e.g., $SiO_2$, SiON, $HfO_2$, $ZrO_2$) on the substrate 100.

Referring again to FIG. 1, the pair of source/drain regions SD may be formed on the well region 110. Forming of the pair of source/drain regions SD may include performing a process of doping the well region 110 between the spacer 300 and the device isolation region 120 that are immediately adjacent to each other. For example, the doping process may include an ion implantation process. The pair of source/drain regions SD may be formed from the top surface of the substrate 100 to a certain depth. For example, the pair of source/drain regions SD may be formed from the top surface of the substrate 100 to a depth greater than the depth of the constant current generating layer 400. The pair of source/drain regions SD may have a conductivity type different from the conductivity type of the well region 110. In the case where the conductivity type of the well region 110 is n-type, a group III element (e.g., B, In) may be implanted into the well region 110 between the spacer 300 and the device isolation region 120, which are immediately adjacent to each other, to form the p-type source/drain region SD. In the case where the conductivity type of the well region 110 is p-type, a group V element (e.g., P, As) may be implanted into the well region 110 between the spacer 300 and the device isolation region 120, which are immediately adjacent to each other, to form the n-type source/drain region SD. The pair of source/drain regions SD may be formed such that lower portions thereof overlap the constant current generating layer 400 in the first direction DR1. Accordingly, the transistor device 10 may be formed.

In example embodiments, the pair of lightly doped regions (not shown) may be formed on the pair of source/drain regions SD in the well region 110, respectively. The pair of lightly doped regions may be formed from the top surface of the substrate 100 to a certain depth, and the pair of source/drain regions SD may be formed from the certain depth to a depth greater than the depth of the constant current generating layer 400. The pair of lightly doped regions may be formed by a doping process. For example, the doping process may include an ion implantation process. The pair of lightly doped regions may have been doped to have the same conductivity type as the pair of source/drain regions SD.

Figure 7:
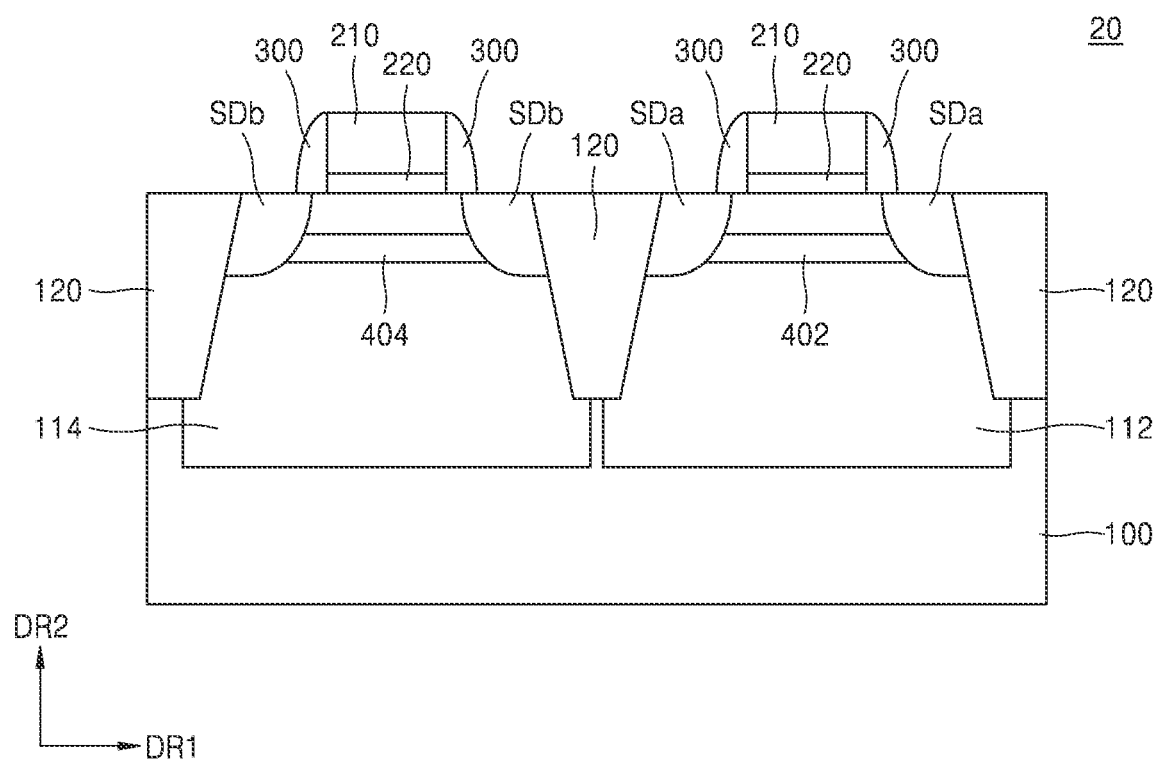
FIG. 7 is a diagram of a ternary inverter device according to example embodiments.
Figure 8:
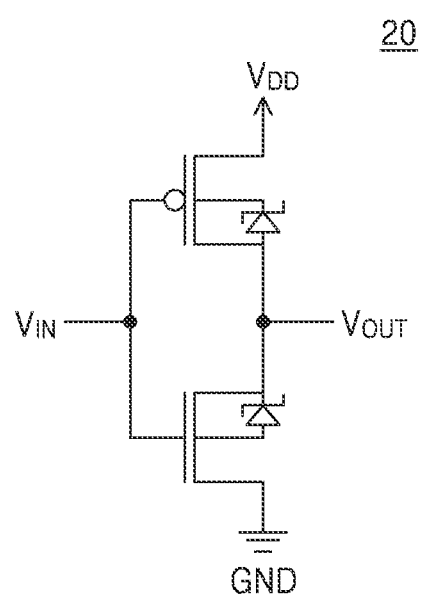
FIG. 8 is a circuit diagram of the ternary inverter device of FIG. 7.

FIG. 7 is a diagram of a ternary inverter device according to example embodiments. FIG. 8 is a circuit diagram of the ternary inverter device of FIG. 7. For brevity of description, substantially the same descriptions as provided with reference to FIG. 1 may not be provided.

Referring to FIG. 7, a ternary inverter device 20 may be provided. The ternary inverter device 20 may include the substrate 100, a first well region 112, the device isolation regions 120, a pair of first source/drain regions SDa, a first constant current generating layer 402, a second well region 114, a pair of second source/drain regions SDb, a second constant current generating layer 404, the gate electrodes 210, the gate insulating films 220, and the spacers 300. The substrate 100 may be substantially the same as that described with reference to FIG. 1.

The device isolation regions 120 may be provided in the substrate 100. Each of the device isolation regions 120 may be substantially the same as each of the pair of device isolation regions 120 described with reference to FIG. 1. The device isolation regions 120 may be arranged in the first direction DR1 parallel to the top surface of the substrate 100. For example, the device isolation regions 120 may be arranged at substantially equal intervals.

The first well region 112 and the second well region 114 may be provided in the substrate 100. The first well region 112 may be spaced apart from the second well region 114 in the first direction DR1. Each of the first well region 112 and the second well region 114 may be provided between the device isolation regions 120 that are immediately adjacent to each other. The conductivity type of the first well region 112 may be n-type. The first well region 112 may include a group V element (e.g., P, As) as an impurity. The conductivity type of the second well region 114 may be p-type. The second well region 114 may include a group III element (e.g., B, In) as an impurity.

The pair of first source/drain regions SDa spaced apart from each other in the first direction DR1 may be provided on the first well region 112. The conductivity type of the pair of first source/drain regions SDa may be p-type. The pair of first source/drain regions SDa may include a group III element (e.g., B, In) as an impurity.

The pair of second source/drain regions SDb spaced apart from each other in the first direction DR1 may be provided on the second well region 114. The conductivity type of the pair of second source/drain regions SDb may be n-type. The pair of second source/drain regions SDb may include a group V element (e.g., P, As) as an impurity.

The first constant current generating layer 402 and the second constant current generating layer 404 may be provided in the first well region 112 and the second well region 114, respectively. The first constant current generating layer 402 may be provided between the pair of first source/drain regions SDa. For example, the first constant current generating layer 402 may overlap the first source/drain regions SDa in the first direction DR1. For example, the first constant current generating layer 402 may be provided between the bottom surface of a channel (not shown) that is formed between the first source/drain regions SDa, and the bottom surfaces of the first source/drain regions SDa. The conductivity type of the first constant current generating layer 402 may be n-type. The first constant current generating layer 402 may include a group V element (e.g., P, As) as an impurity. For example, the second constant current generating layer 404 may be provided between the pair of second source/drain regions SDb. For example, the second constant current generating layer 404 may overlap the second source/drain regions SDb in the first direction DR1. For example, the second constant current generating layer 404 may be provided between the bottom surface of a channel (not shown) that is formed between the second source/drain regions SDb, and the bottom surfaces of the second source/drain regions SDb. The conductivity type of the second constant current generating layer 404 may be p-type. The second constant current generating layer 404 may include a group III element (e.g., B, in) as an impurity.

The gate electrodes 210 may be provided above the first well region 112 and the second well region 114, respectively. The gate insulating films 220 may be provided between the gate electrodes 210 and the top surface of the substrate 100, respectively. The spacers 300 may be provided on sidewalls of the gate electrodes 210, respectively.

The first well region 112, the pair of first source/drain regions SDa, the first constant current generating layer 402, the gate electrode 210, the gate insulating film 220, and the spacers 300 provided on both sidewalls of the gate electrode 210 may define a PMOS transistor. The second well region 114, the pair of first source/drain regions SDa, the second constant current generating layer 404, the gate electrode 210, the gate insulating film 220, and the spacers 300 provided on both sidewalls of the gate electrode 210 may define an NMOS transistor.

Referring to FIG. 8, a ground voltage may be applied to a source (one of the pair of second source/drain regions of FIG. 7) and a substrate (the second well region of FIG. 7) of the NMOS transistor device. For brevity of description, it is assumed that the ground voltage is 0 volt (V). A driving voltage $V_{DD}$ may be applied to a source (one of the pair of first source/drain regions of FIG. 7) and a substrate (the first well region of FIG. 7) of the PMOS transistor device. An input voltage Vin may be applied to each of a gate electrode (the gate electrode on the second well region of FIG. 7) of the NMOS transistor device and a gate electrode (the gate electrode on the first well region of FIG. 7) of the PMOS transistor device.

A drain (the other one of the pair of second source/drain regions of FIG. 7) of the NMOS transistor device may be electrically connected to a drain (the other one of the pair of first source/drain regions of FIG. 7) of the PMOS transistor device such that they respectively have identical voltages. The voltages of the drain of the NMOS transistor device and the drain of the PMOS transistor device may be an output voltage Vout of the ternary inverter device 20.

A constant current may flow from the drain to the substrate of the NMOS transistor device. A constant current may flow from the substrate to the drain of the PMOS transistor device. The constant currents may be independent from the input voltage Vin.

In one example, a first input voltage may be applied to the gate electrode of the PMOS transistor device and the gate electrode of the NMOS transistor device, such that the PMOS transistor device has a constant current that is stronger than a channel current and the NMOS transistor device has a channel current that is stronger than a constant current. In this case, the output voltage Vout of the ternary inverter device 20 may be a first voltage.

In another example, a second input voltage may be applied to the gate electrode of the PMOS transistor device and the gate electrode of the NMOS transistor device, such that the NMOS transistor device has a constant current that is stronger than a channel current and the PMOS transistor device has a channel current that is stronger than a constant current. In this case, the output voltage of the ternary inverter device 20 may be a second voltage greater than the first voltage.

In another example, a third input voltage may be applied to the gate electrode of the PMOS transistor device and the gate electrode of the NMOS transistor device, such that each of the NMOS transistor device and the PMOS transistor device has a constant current that is stronger than a channel current. In this case, the output voltage of the ternary inverter device 20 may be a third voltage between the first voltage and the second voltage.

The constant current flowing from the drain to the substrate of the NMOS transistor device and the constant current flowing from the substrate to the drain of the PMOS transistor device may flow regardless of the gate voltages applied to the gate electrodes of the PMOS transistor device and the NMOS transistor device. A current in the ternary inverter device 20 may flow from the substrate of the PMOS transistor device to the substrate of the NMOS transistor device via the drain of the PMOS transistor device and the drain of the NMOS transistor device. The driving voltage $V_{DD}$ may be divided by a resistance between the substrate of the PMOS transistor device and the drain of the PMOS transistor device, and a resistance between the substrate of the NMOS transistor device and the drain of the NMOS transistor device. The output voltage Vout may be a voltage to which the driving voltage $V_{DD}$ is dropped by the resistance between the substrate of the PMOS transistor device and the drain of the PMOS transistor device. Accordingly, the output voltage Vout may have a value between the driving voltage $V_{DD}$ and 0 V.

The output voltage Vout may have the first voltage (State '0'), the third voltage (State '1') greater than the first voltage, or the second voltage (State '2') greater than the third voltage, according to the input voltage Vin. The present disclosure may provide the ternary inverter device 20 having three states according to the input voltage Vin.

In example embodiments, the lightly doped regions (not shown) may be provided on the pair of first source/drain regions SDa and the pair of second source: drain regions SDb. For example, the lightly doped regions may be respectively arranged between the pair of first source/drain regions SDa and the spacers 300 immediately adjacent thereto, and between the pair of second source/drain regions SDb and the spacers 300 immediately adjacent thereto. Each of the lightly doped regions may extend in the first direction DR1 to contact the device isolation regions 120.

The conductivity type of the lightly doped regions on the pair of first source/drain regions SDa may be n-type. The doping concentration of the lightly doped regions on the pair of first source/drain regions SDa may be less than the doping concentration of the pair of first source/drain regions SDa.

The conductivity type of the lightly doped regions on the pair of second source/drain regions SDb may be p-type. The doping concentration of the lightly doped regions on the pair of second source/drain regions SDb may be less than the doping concentration of the pair of second source/drain regions SDb.

The lightly doped regions may reduce the occurrence of a short-channel effect and a hot-carrier effect. Accordingly, the electrical characteristics of the ternary inverter device 20 may be improved.

Figure 9:
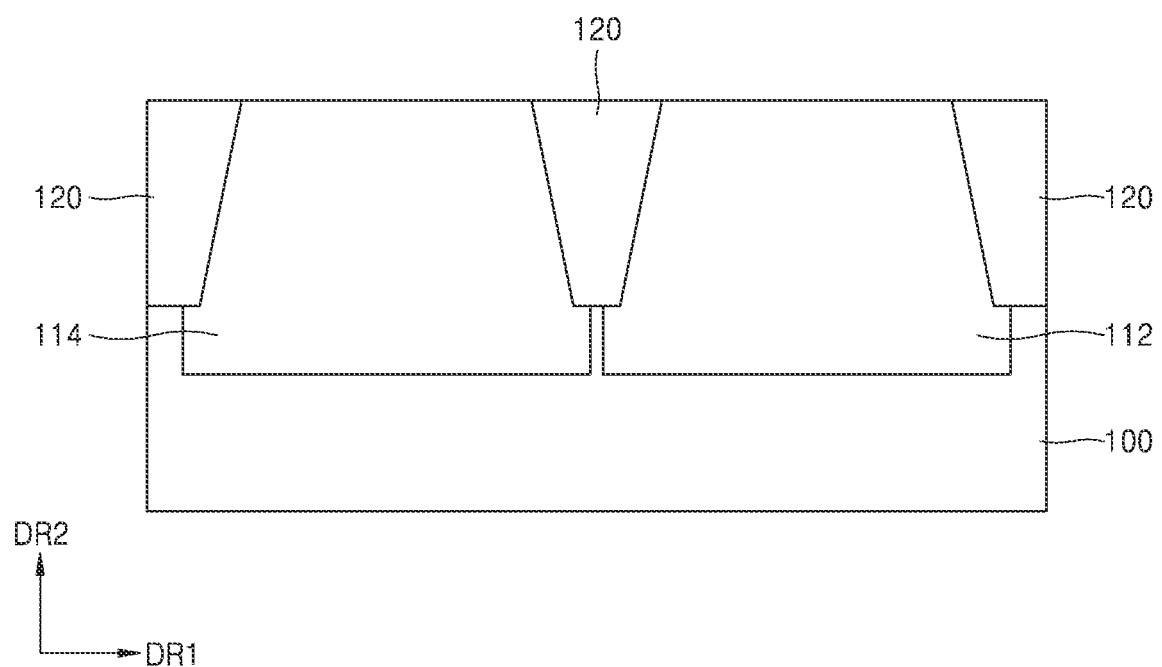
FIG. 9 is a diagram for describing a method of manufacturing the ternary inverter device of FIG. 7.
Figure 10:
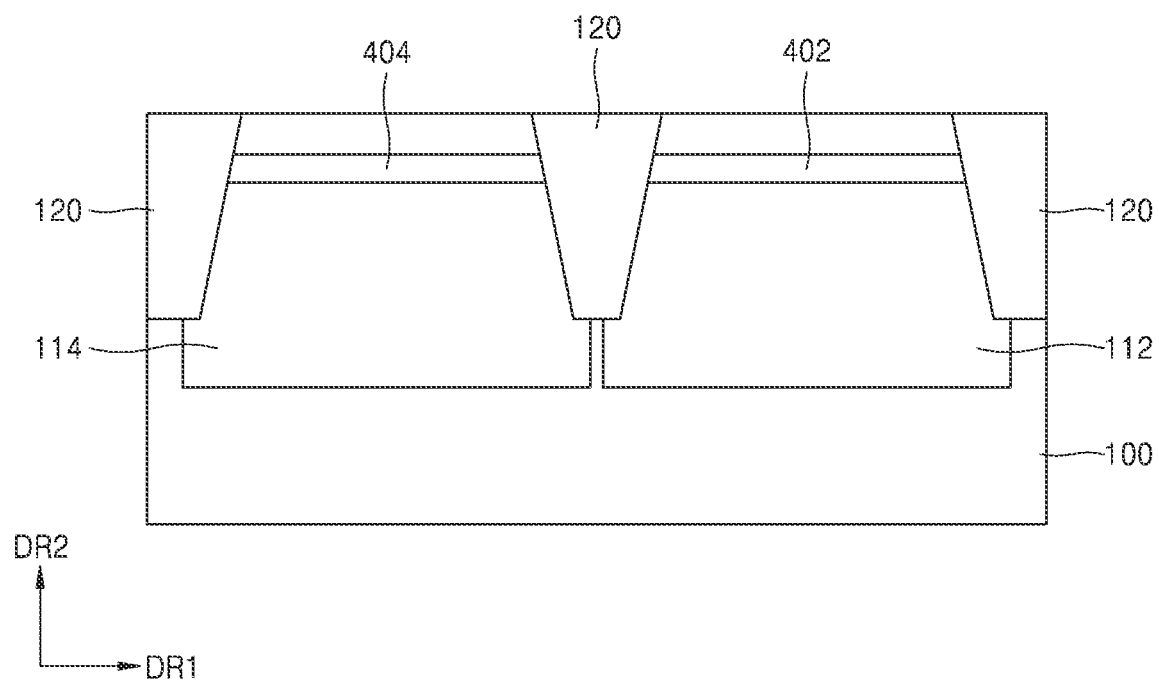
FIG. 10 is a diagram for describing a method of manufacturing the ternary inverter device of FIG. 7.
Figure 11:
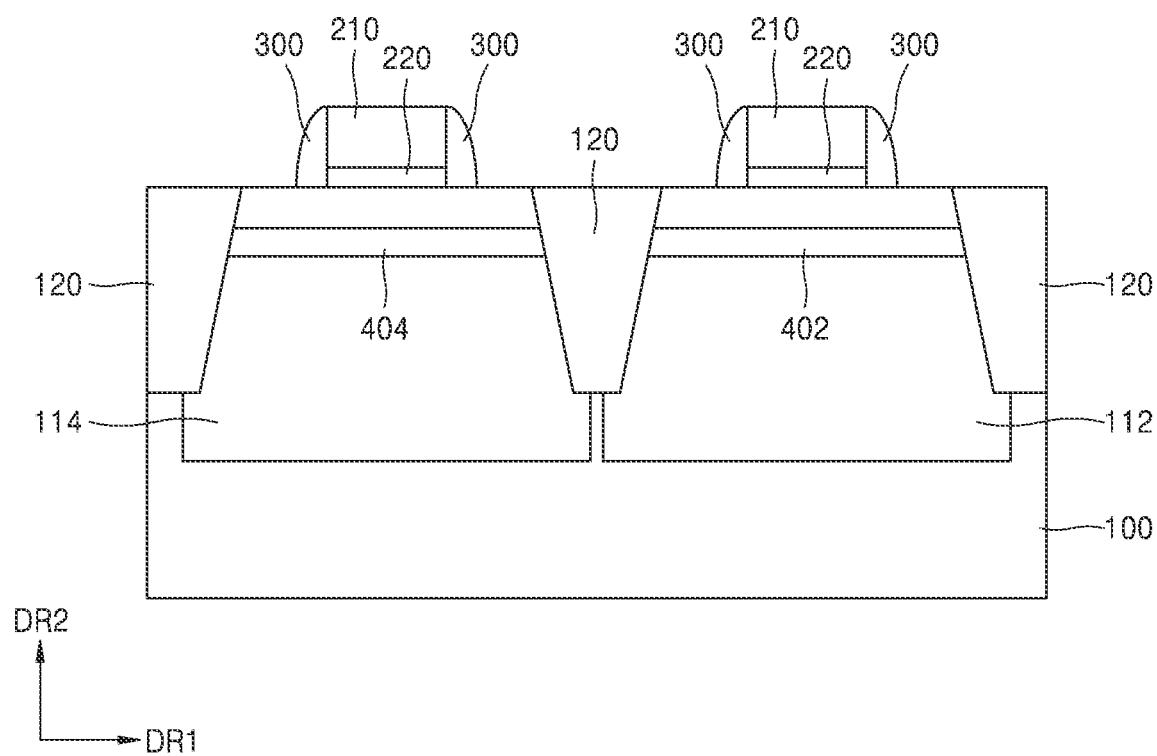
FIG. 11 is a diagram for describing a method of manufacturing the ternary inverter device of FIG. 7.

FIG. 9 is a diagram for describing a method of manufacturing the ternary inverter device of FIG. 7. FIG. 10 is a diagram for describing a method of manufacturing the ternary inverter device of FIG. 7. FIG. 11 is a diagram for describing a method of manufacturing the ternary inverter device of FIG. 7. For brevity of description, substantially the same descriptions as provided with reference to FIGS. 4 to 6 and FIG. 7 may not be provided.

Referring to FIG. 9, the device isolation regions 120 may be formed in the substrate 100. A process of forming the device isolation regions 120 may be substantially the same as the process of forming the pair of device isolation regions 120 described with reference to FIG. 4.

The first well region 112 may be formed between a pair of device isolation regions 120 that are directly adjacent to each other, among the device isolation regions 120. The first well region 112 may be formed by a process of doping the substrate 100 with a group V element (e.g., P, As). The conductivity type of the first well region 112 may be n-type.

The second well region 114 may be formed between another pair of device isolation regions 120 that are directly adjacent to each other, among the device isolation regions 120. The second well region 114 may be formed by a process of doping the substrate 100 with a group III element (e.g., B, In). The conductivity type of the second well region 114 may be p-type.

Referring to FIG. 10, the first constant current generating layer 402 may be formed on the first well region 112. For example, the first constant current generating layer 402 may be provided between the bottom surface of the channel (not shown) that is formed between the first source/drain regions SDa (FIG. 6), as described above with reference to FIG. 7, and the bottom surfaces of the first source/drain regions SDa (FIG. 6). Forming of the first constant current generating layer 402 may include a process of implanting a group V element (e.g., P, As) into an upper portion of the first well region 112. The conductivity type of the first constant current generating layer 402 may be n-type. The second constant current generating layer 404 may be formed on the second well region 114. For example, the second constant current generating layer 404 may be provided between the bottom surface of the channel (not shown) that is formed between the second source/drain regions SDb (FIG. 6), as described above with reference to FIG. 7, and the bottom surfaces of the second source/drain regions SDb (FIG. 6). Forming of the second constant current generating layer 404 may include a process of implanting a group III element (e.g., B, In) into an upper portion of the second well region 114. The conductive type of the second constant current generating layer 404 may be p-type.

After impurities are implanted into the first and second well regions 112 and 114, the first and second well regions 112 and 114 may be heat-treated. A thermal budget of the heat treatment process may affect threshold voltage characteristics and constant currents of the transistor devices in the ternary inverter device 20 (FIG. 7). For example, in the case where the thermal budget is greater than that required, the impurities implanted into the upper portions of the first and second well regions 112 and 114 may be diffused into the channels and thus change threshold voltages. For example, in the case where the thermal budget is greater than that required, the doping concentrations between the pair of first source/drain regions SDa and the first constant current generating layer 402 and between the pair of second source/drain regions SDb and the second constant current generating layer 404 may be gradually changed, and thus the magnitudes of the constant currents may be reduced. When performing the heat treatment process, the thermal budget may be adjusted such that the threshold voltage characteristics of the transistor devices in the ternary inverter device 20 (FIG. 7) are not changed or are minimally changed, and the transistor devices in the ternary inverter device 20 (FIG. 7) have a required constant current. Referring to FIG. 11 the gate electrode 210, the gate insulating film 220, and the pair of spacers 300 may be formed above each of the first well region 112 and the second well region 114. Forming of the gate electrode 210, the gate insulating film 220, and the pair of spacers 300 may be substantially the same as that described with reference to FIG. 6.

Referring again to FIG. 7, the pair of first source/drain regions SDa may be formed on the first well region 112. Forming of each of the pair of first source/drain regions SDa may include a process of implanting a group III element (e.g., B, In) into the first well region 112 between the spacer 300 and the device isolation region 120 immediately adjacent to each other. The conductivity type of the first source/drain regions SDa may be p-type.

The pair of second source/drain regions SDb may be formed on the second well region 114. Forming of each of the pair of second source/drain regions SDb may include a process of implanting a group V element (e.g., P, As) into the second well region 114 between the spacer 300 and the device isolation region 120 that are directly adjacent to each other. The conductivity type of the second source/drain regions SDb may be n-type.

Accordingly, the ternary inverter device 20 may be provided.

In example embodiments, the lightly doped regions (not shown) may be formed on the pair of first source/drain regions SDa and the pair of second source/drain regions SDb, respectively. The lightly doped regions may be formed from the top surface of the substrate 100 to a certain depth, and the pair of first source/drain regions SDa and the pair of second source/drain regions SDb may be formed from the certain depth to a depth greater than the depth of the first and second constant current generating layers 402 and 404. The lightly doped regions may be formed by a doping process. For example, the doping process may include an ion implantation process. The conductivity type of the lightly doped regions on the pair of first source/drain regions SDa may be the same as that of the pair of first source/drain regions SDa. The conductivity type of the lightly doped regions on the pair of second source/drain regions SDb may be the same as that of the pair of second source/drain regions SDb.

Figure 12:
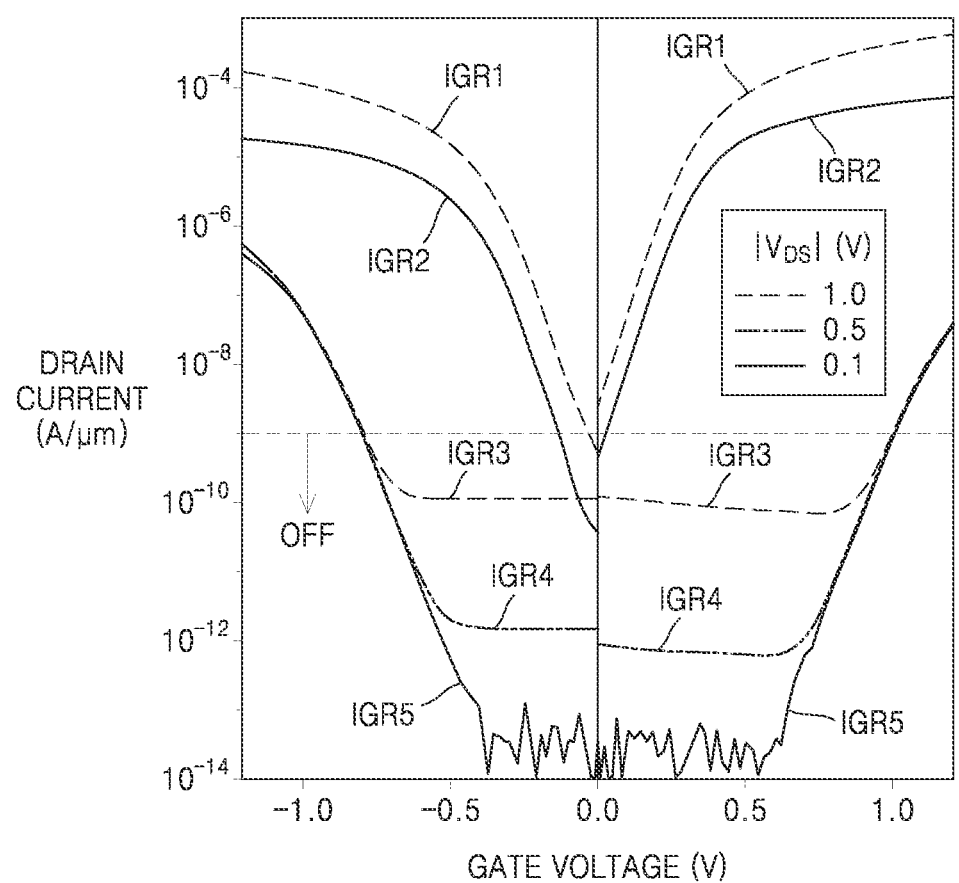
FIG. 12 shows gate voltage-drain current graphs of the ternary inverter devices of the present disclosure and binary inverter devices.

FIG. 12 shows gate voltage-drain current graphs of the ternary inverter devices of the present disclosure and binary inverter devices.

Referring to FIG. 12, gate voltage-drain current graphs IGR1 and IGR2 of the binary inverter devices and gate voltage-drain current graphs IGR3, IGR4, and IGR5 of the ternary inverter devices of the present disclosure are illustrated.

Drain currents of the binary inverter devices did not have a constant current component flowing regardless of a gate voltage.

Drain currents of the ternary inverter devices of the present disclosure had a constant current component flowing regardless of a gate voltage. For example, even when the ternary inverter devices of the present disclosure had an oft state, a constant current flowed through the ternary inverter devices of the present disclosure.

Figure 13:
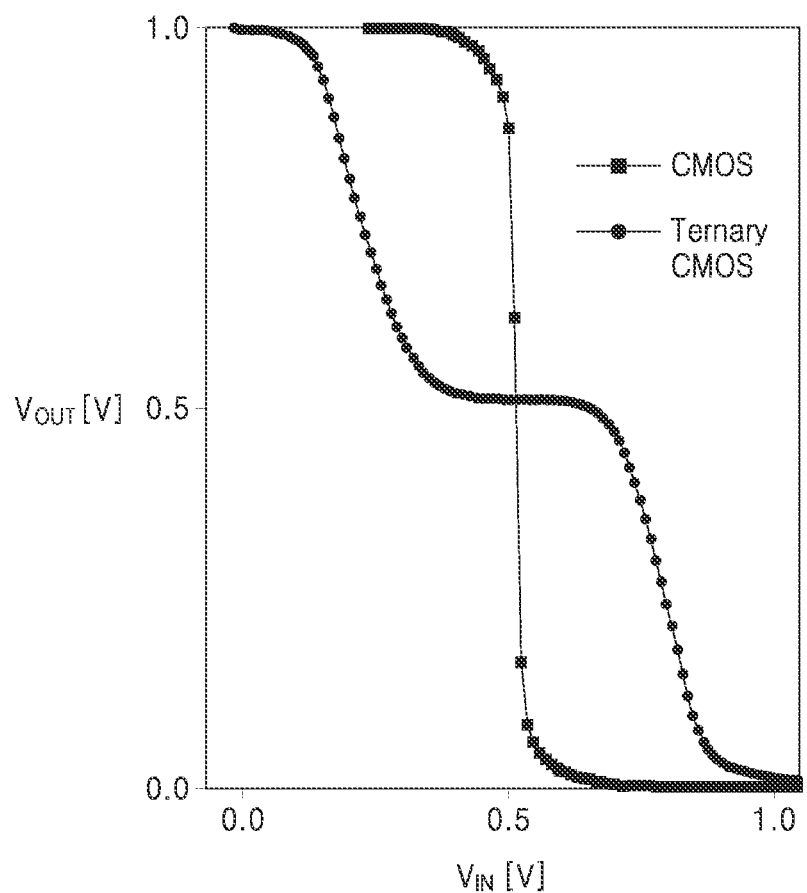
FIG. 13 shows an input voltage Vin-output voltage Vout graph of the ternary inverter device of the present disclosure and a binary inverter device.

FIG. 13 shows an input voltage Vin-output voltage Vout graph of the ternary inverter device of the present disclosure and a binary inverter device.

Referring to FIG. 13, the driving voltages $V_{DD}$ of the ternary inverter device 20 and the binary inverter device were 1.0 V, and a ground voltage GND was 0 V. The input voltages Vin of the ternary inverter device 20 and the binary inverter device were 0 V to 1.0 V.

In the case of the binary inverter device, when the input voltage was changed from 0 V to 1 V, the output voltage Vout rapidly decreased from 1 V to 0 V in the vicinity of an input voltage of 0.5 V. That is, the binary inverter device has two states (e.g., State '0' and State '1').

In the case of the ternary inverter device of the present disclosure, when the input voltage was changed from 0 V to 1 V, the output voltage Vout rapidly decreased from 1 V to 0.5 V, then plateaued at 0.5 V, and then rapidly decreased from 0.5 V to 0 V once more. That is, the ternary inverter device of the present disclosure has three states (e.g., State '0', State '1', and State '2').

The above description of the embodiments of the spirit of the present disclosure provides examples for the description of the spirit of the present disclosure. Therefore, the spirit of the present disclosure is not limited to the above embodiments, and it is apparent that various modifications and changes may be made by one of ordinary skill in the art, within the spirit of the present disclosure, for example, by combining the above embodiments.

The invention claimed is:

1. A transistor device comprising:
   a substrate;
   a source region provided on the substrate;
   a drain region in the substrate, the drain region being spaced apart from the source region in a direction parallel to a top surface of the substrate;
   a gate electrode provided on the substrate and between the source region and the drain region;
   a gate insulating film interposed between the gate electrode and the substrate; a channel region formed under the gate insulating film;
   a well region formed in the substrate and at least partially in direct contact with bottom surfaces of a pair of the source region and the drain region; and
   a constant current generating layer directly contacts the pair of the source region and the drain regions, extending between the source region and the drain region, in the direction parallel to the top surface of the substrate, and the constant current generating layer being positioned deeper than the channel but shallower than bottom surfaces of the pair of the source region and the drain regions,
   wherein the constant current generating layer generates a constant current between the drain region and the well region, and the constant current is a band-to band tunneling (BTBT) current that flows:
   from the source region or the drain region through the constant current generating layer to the well region in the substrate, or
   from the well region in the substrate through the constant current generating layer to the source region or the drain region,
   wherein the constant current is independent from a gate voltage applied to the gate electrode, wherein the substrate and the constant current generating layer have a first conductivity type, wherein the source region and the drain region have a second conductivity type that is different from the first conductivity type, and wherein a doping concentration of the constant current generating layer is greater than a doping concentration of the substrate, wherein an electric field is formed between the drain region and the constant current generating layer, and an intensity of the electric field is $10^6$ V/cm or greater.

2. The transistor device of claim 1, wherein the constant current generating layer is provided between a channel formed on the substrate and a bottom surface of the drain region.

3. The transistor device of claim 1, wherein the doping concentration of the constant current generating layer is $3 \times 10^{18}$ cm$^{-3}$ or greater.

4. The transistor device of claim 1, wherein the substrate and the source region have the same voltage.

5. The transistor device of claim 1, wherein the well region is formed in the substrate and has the first conductivity type.

6. The transistor device of claim 1, further comprising a pair of device isolation regions provided on the well region and spaced apart from each other in a first direction parallel to the top surface of the substrate.

7. The transistor device of claim 6, wherein the pair of device isolation regions includes an insulating material.

* * * * *